(12) United States Patent
Thomas

(10) Patent No.: US 7,583,530 B2
(45) Date of Patent: Sep. 1, 2009

(54) MULTI-BIT MEMORY TECHNOLOGY (MMT) AND CELLS

(76) Inventor: Mammen Thomas, 103 Schooner Cove, Hercules, CA (US) 94547

( * ) Notice: Subject to any disclaimer, the term of this patent is extended or adjusted under 35 U.S.C. 154(b) by 403 days.

(21) Appl. No.: 11/541,080

(22) Filed: Oct. 2, 2006

(65) Prior Publication Data
US 2008/0081410 A1    Apr. 3, 2008

(51) Int. Cl.
*G11C 11/34* (2006.01)
*G11C 16/04* (2006.01)
*G11C 5/06* (2006.01)

(52) U.S. Cl. ............ 365/185.05; 365/185.17; 365/185.18; 365/185.28; 365/185.29; 365/72

(58) Field of Classification Search ......... 365/185.03, 365/185.05, 185.17, 185.18, 185.21, 185.28, 365/185.29, 63, 72
See application file for complete search history.

(56) References Cited

U.S. PATENT DOCUMENTS

| 6,654,282 | B2 * | 11/2003 | Kanai | 365/185.05 |
| 7,212,437 | B2 * | 5/2007 | Atti et al. | 365/185.05 |
| 7,502,261 | B2 * | 3/2009 | Harari | 365/185.17 |
| 2006/0198199 | A1 * | 9/2006 | Pittikoun et al. | 365/185.28 |
| 2009/0086540 | A1 * | 4/2009 | Hung et al. | 365/185.05 |

* cited by examiner

*Primary Examiner*—LY D Pham

(57) ABSTRACT

Non-volatile multi-bit memory cells are programmed by hot electron programming and erased by high voltage tunneling, or by the use of a lower voltage Metal-Insulator-Metal (MIM) Diode carrier generation method and technology called the Tunnel-Gun (TG), in which the use of a Nitride layer or a silicon-nodule layer having location-specific charge storage elements with no spreading allows easy implementation of multi-bit technology. If charges are stored in the traps in the Nitride storage layer, an Oxide Nitride Oxide is used as the storage element. If charges are stored in layer of discrete silicon-nodules separated by a thin insulating film, an Oxide silicon-nodule Oxide storage element is used as the storage layer.

17 Claims, 9 Drawing Sheets

Prior Art NROM (Mirror Bit cell)**

Mirror Bit Cell**

MMT-1 Cell
Two Bit storage cell (CS along diffusions)

MMT-1 cell (CS across the cell at storage node)

MMT -2 Cell
Multi-Bit Memory Technology-2 Cell with burried diffusion

MMT-2 Cell Bit area CS

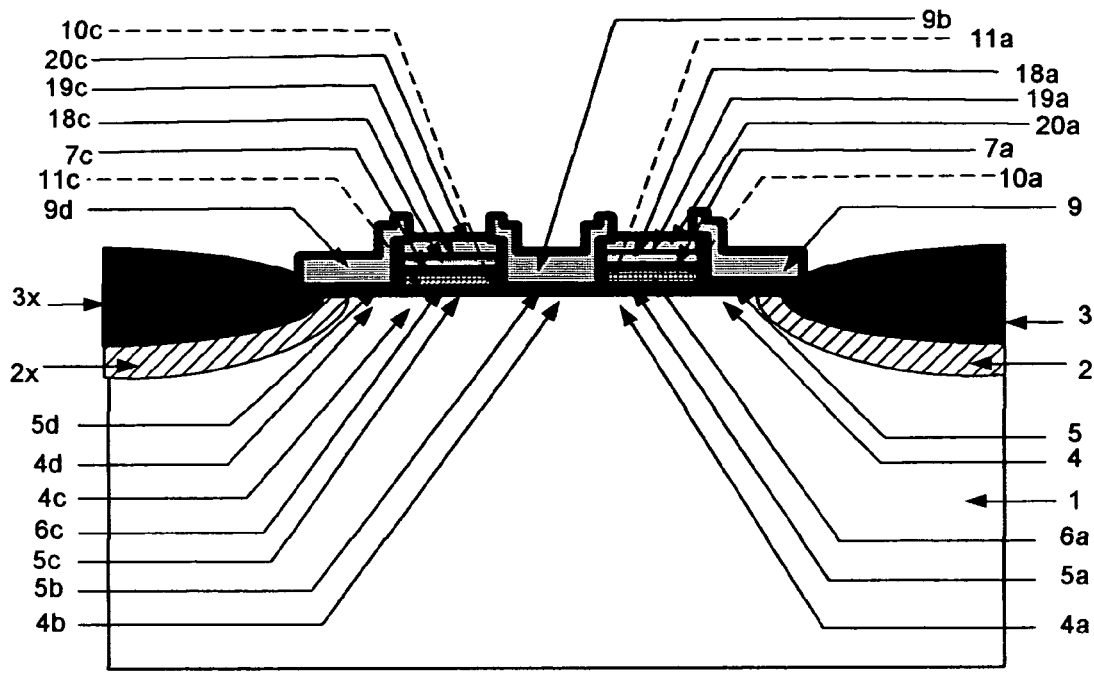
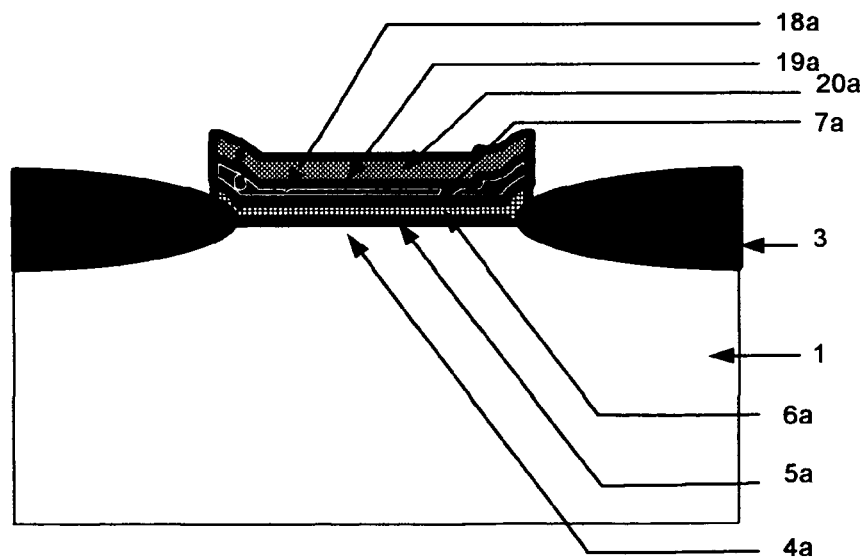

MMT-4 Cell
Multi-bit Memory Technology -4 Cell with contacts

MMT-4 Cell Bit area CS

MMT-5 Cell
Multi-bit Memory Technology-5 Cell with contacts( CS along length)

MMT-5 Cell Cross section along the width

MMT-6 Cell
Multi-bit Memory Technology-6 Cell with contacts

MMT-7 Cell
Multi-bit Memory Technology-7 Cell with contacts

MMT-8 Cell
Multi-bit Memory Technology-8 Cell with contacts

MULTI-BIT MEMORY TECHNOLOGY (MMT) AND CELLS

SUMMARY OF INVENTION

As the process development has matured and technology has scaled to smaller and smaller dimensions, the Poly-silicon floating gate cell is approaching its scaling limitations, multi-bit storage in a single memory cell has become the norm. The use of a Nitride layer or a silicon-nodule layer capable of location specific charge storage with no spreading, allows easy implementation of multi-bit technology. If the charge is stored in the traps in the Nitride storage layer, a Oxide Nitride Oxide is used as the storage element. If charge is stored in layer of discrete silicon-nodules separated by a thin insulating film, an Oxide silicon-nodule Oxide storage element is used as the storage layer.

The multi-bit cells proposed are programmed by hot electron programming and erased either by using high Voltage tunneling, or by use of a lower voltage MIM Metal-Insulator-Metal Diode carrier generation method and technology called the Tunnel-Gun or TG.

FIELD OF INVENTION

This invention relates to the structure and method of Programmable/Erasable multi-bit Non-Volatile Memory cell technology for data storage applications.

1. Background

Multi-bit programming has been an aim of Non-volatile memory designers for a long time to increase the density of data storage capacity of the memory. In the case of standard Poly-silicon floating gate memory cells, this effort has been limited by problems of separating the bits in terms of the quantity of charge stored in the floating gate. The advances in the process technology and the continued shrinking of the cell size has made the use of traps in Nitride film in an ONO storage element acceptable for data storage in a memory cell. A feature of the Nitride film is that any charge stored at a location in the traps in the Nitride film does not move from that location or spread as the film itself is non-conductive. Similarly the use of a layer of silicon-nodules and Buckyballs separated by barrier oxide forming discrete potential wells is being disclosed as becoming a possible storage layer where on Oxide silicon-nodule Oxide (OsnO) layer is used as the storage element. This storage film due to existence of a barrier between the silicon nodules does not allow charge spreading and charge movement from the storage location, namely nodule to nodule. This feature allows storage of data at different locations in a cell if a method of programming and erasing these locations can be implemented. The use of insulated bucky balls and carbon nano-tubes are also proposed as possible storage elements. Such storage where the location of storage is fixed and charge movement is limited is called location-specific storage.

2. Prior Art

The only multi-bit prior art cell which use this location-specific storage principle today is with Nitride based storage and is the Mirror Bit shown in FIG. 1. No cells with silicon-nodule or carbon bucky-balls or carbon nano-tubes storage layer has been identified as existing or proposed.

The prior art Cell shown is the mirror bit cell with capability to store two bits. As erase mechanism used by the mirror bit cell is by generation of P type carriers using band to band tunneling and neutralization of electron charge induced at the diffusion by hot electron carriers, the cell is difficult to extend to more than two bit storage. The cell has buried diffusions (1 and 1*a*) and consists of an ONO {Oxide (4)-Nitride (6)-Oxide (7)} layer deposed between the two buried Source/Drain diffusions (1) and (1*a*), forming the storage element. In the case of this type of cell either of the diffusions can act as the source or the drain depending on the location of the bit being programmed, erased and read. The charge during programming is stored in the traps that exist in the Nitride layer (6) and is protected from leaking off during thermal cycling and read operations by the Oxide layers of the ONO storage element. A Control gate electrode (9) over lay the storage element.

The mirror-bit cell is a multi-bit cell, which is capable of storing charge at both ends of the Nitride layer at locations shown (10 and 11) in the Nitride film (6). During programming of bit 1, a high voltage of the order, typically, of 4-7 V is applied to the drain {drain diffusion} (1) with a high voltage of the order of 11V to the poly-silicon Control gate (9) and ground to the source {source diffusion}(1*a*). This causes a high current flow in the channel (3) beneath the storage element with impact ionization due to hot electrons at the drain (1) junction. The Channel Hot-Electron (CHE) generation creates a large number of Electron Hole pairs at the junction. A very small portion of the generated Channel Hot-Electrons (CHE) will have a velocity component to over come the barrier of the Oxide and enter the Nitride, causing programming by accumulation of, typically, negative charge in the traps in the nitride film (6) at storage location (10). Similarly by reversing the source to (1) and drain TO (1*a*) during programming will cause bit 2to be programmed at location 11. The read of the bit 1is done by reversing the source and drain used for write, with source (1) and drain (1*a*) so that the location 11 is covered by the depletion region from the drain voltage while location 10 is in the channel and can modulate the conductance. Similarly bit 2is read by reversing the drain and source that is with drain (1) and source (1*a*).

The erase is by applying a high voltage of 8V or higher to the junction to be erased. A negative voltage of close to −2V is applied to the Control gate causing the hot holes generated due to Band to Band (B to B) tunneling to be pulled into the Nitride and neutralize the negative charge stored in the Nitride. In order that the erase and program take place at the same location, one due to hot electron generation and the other due to B to B tunneling, using differing mechanisms and voltages, it is necessary to have very critical drain engineering. This is a very complex process and can lead to loss of yield for any variations. Typically the charge storage is limited in the Nitride to a region of the order of 200A to 400A in length around or from the location of the charge generation. The programming in addition uses high currents and voltages at the drains of the device causing high power dissipation. Another disadvantage of the cell is the need to prevent the cell from over erase. If the cell is over programmed the inherent cell leakage of un-selected cells during read will create error in read of the selected cell. This requirement makes the programming of these cells an iterative process with shut off of programmed cells as they reach a threshold. This need make the peripheral circuitry complex and design more difficult to achieve.

Some of the problems that exist with the current Nitride cells include:

1. The voltages required on the source and drain of the devices are large for the erase causing cell to cell separation or isolation to be larger than minimum.
2. The high junction voltages with high programming currents also have the problem of increasing the channel lengths of the devices to eliminate punch through and leakage effects.

3. The devices sizes are larger than minimum due to the above two needs.
4. Drain engineering is a complex process for these high voltage junctions where program and erase has to happen at the same location using different methods with high voltages.
5. Over time the Nitride accumulates charge away from the erase location causing un-wanted read characteristics.
6. Cell leakage currents in the unselected cells require that source bias is applied to the array during read operation to increase the Vt of the gate.
7. The high current and high voltages translate to high power dissipation during program and erase.
8. Need for high voltage devices in the data path tend to limit speed of access.
9. High process complexity and circuit complexity exist due to multiple voltage levels and voltage polarity needed by the cell.

What is Proposed is:

Multi-bit Nitride memory cells and multi-bit silicon-nodule memory cells and other cells with location specific storage elements, with capability to store two or more bits per storage device, where storage gates and select/program gates are deposed in an alternating fashion over an integrated channel region established between a pair of Source/Drain diffusions. Each storage gate has at least two storage locations or storage nodes that are programmable by Hot-electron programming using a select/program gate in series with the storage gate enabling lower current/lowervoltage programming and erased by either Tunneling using high voltage to remove the stored charge or by use of MIM diode method (TG method) of generating carriers, in the typical case holes, to neutralize the stored charge in the location specific storage element, typically ONO with Nitride traps, or OsnO with the layer of insulated Silicon-nodules. In the case of the silicon-nodule storage, the charge storage takes place in the discrete silicon-nodules, where each nodule can store a discrete amount of charge in potential wells in silicon, similar to a trap site in Nitride. It should be understood that it is possible to use only one of the storage locations or nodes in each storage gate to reduce the complexity of program, erase and read of the cells, though two locations on each element can be used, by inter-changing the source and drain diffusions, for doubling the capacity with increased complexity of operation. For the purpose of simplicity the cell operation of the multi-bit cells are explained using Nitride trap storage. It should be understood that it is possible to replace the Nitride storage layer in most of the cells, except the one where the ONO is used as the gate dielectric under the select/program gate, by the silicon-nodule layer, bucky ball layer or other lacation-specific material layer with no differences in program and erase operations as will be well known to the practitioners of the art.

What is disclosed is a method of programming a memory cell having select/program gates inter-spaced with storage gates which enable the use of low current programming by hot electron generation and erase by FN-Tunneling or TG carrier generation method. The programming takes place by using the velocity saturated carriers form a select/program gate that is biased in pinch off (just on for low current) with a reasonably high voltage applied to the drain to cause hot carriers to be generated, a portion of which has enough energy to overcome the oxide barrier and get into the storage element and get stored in the traps in the nitride or stored in the potential wells of the discrete silicon-nodules. The multiple alternating select/program gates, and storage gates allow multiple programming nodes or locations to be deposed between a pair of source/drain diffusions. The select/program gates comprise a gate oxide over a channel region and a conductive select/program gate layer over the gate oxide. A nitride based storage gate will comprise of a Nitride storage layer in an ONO storage element paced over a channel region, under laying a conductive control gate layer, with storage nodes at either end of the storage element. Similarly a silicon-nodule based storage gate will comprise of a silicon-nodule storage layer in an OsnO storage element placed over a channel region, under laying a conductive control gate layer, with storage nodes at either end of the storage element.

As the program charge is stored in the traps in Nitride layer, or in the discrete silicon-nodules in the silicon-nodule storage layer, the charge do not spread or move, and it is possible to have one or two or more program locations in a single device, based on the program, erase and read capability established allowing a specific locations in a storage element to be charged. In the cells described each storage element is capable of one or two bits of storage. By spacing the diffusions away from the storage node the diffusions can be made standard source/drain diffusions reducing the complexity of drain engineering. By having select/program gates, on either side of the storage gate, it is possible to have up to two bits of data stored in each storage gate. By having multiple storage gates and select/program gates in the memory cell, between a pair of diffusions (source/drain diffusions) the number of bits stored per cell can be increased. (Detailed explanation of the operation is provided later in the disclosure.) By having a number of storage elements made up of ONO in the case of Nitride trap storage or OsnO in the case of silicon-nodule storage, within one cell this method of programming allow multi-bit storage with reduced area usage. The cell is hence made of multiple storage gates and select/program gates deposed in an alternating fashion, over an integrated channel, between two standard diffusion regions as shown in FIG. 3, 4 for a two bit cell, and FIG. 5, 6 and FIG. 7, 8, for a four bit cell. Larger bit count cells by extending the technology are shown in FIG. 13, FIG. 14 and FIG. 15. It should be noted that FIG. 14 shows a modification that may be introduced to all the disclosed Nitride storage cell types, (limited to the Nitride storage cells only, excluding the silicon nodule cells), to make manufacturability better, where the ONO gate material is used for the select/program gate as well as the storage gate, allowing a single layer of ONO deposition over the channel region. This single ONO deposition may be used for any of the cells extending from 2 bit to n-bit, where ONO is the storage element, though only the n-bit cell (FIG. 14) is shown as an example. The disadvantage is that the ONO thickness used is larger and hence there is no optimization possible for these gates.

Erase is possible by use of the Fouler-Nordheim tunneling that is well known in the Non-volatile memory industry or by the TG technology that is proposed. The cells using FN tunneling for erase are shown in FIG. 3,4 FIG. 5, 6 FIG. 13, and FIG. 14. The erase is by applying a high voltage gradient across the storage element to cause the stored charge to tunnel out to the silicon by overcoming the oxide barrier. This has What is also disclosed is the use of TG technology for efficient erase of the Nitride and silicon-nodule based cells as an alternative to FN tunneling. The FIG. 7, 8 and FIG. 15 show the use of the Metal-Insulator-Metal diode (TG) technology for erase. The TG technology uses a stack comprising of an Injector Electrode (IE) (20), a thin Barrier layer (19) and Collector Grid Electrode or Grid electrode (CGE) (18) deposed over the storage element of the cell, over ONO storage element in the case of the Nitride cell or over OsnO storage element in the Silicon Nodule cell, in place of the poly-silicon control gate. A potential difference applied between the Injector and Grid electrodes of sufficient magnitude allow carriers (in the typical case holes—note also that depending on the potential electron injection can also be accomplished if needed) to be injected into the barrier. Since the Grid Electrode has a thickness less than the mean free path length of the carrier in the material, some of the energetic carriers pass through the CGE to over come the barrier height of the oxide barrier of the storage element and drift towards the Nitride traps, to get trapped in them, in the case of storage in Nitride traps, or towards the silicon-nodules in the case of storage in the nodules, to drop into the potential well of silicon in the silicon-nodule. This movement of carriers is possible only if there is a supporting field across the storage element insulator. These carriers can be and are used to neutralize the stored negative charge in the Nitride traps or silicon-nodules and charge the traps with charge of the opposite polarity to that used in programming. This mode of erase is not location dependant and can be used for the whole cell, of multiple storage elements at one time or for stored charge in a single storage element in a cell. In the case of an array this will mean that all rows of storage elements in a cell can be erased at a time or a single row of elements can be erased, as per the design choice made.

FIG. 9,10 and FIG. 11, 12, show a two storage element device, which can store up to four bits of data using a combination of two hot carrier methods, one at the drain depletion and the other using the select/program gate away from the diffusion edge for program operation. The first method is similar to the mirror bit, where two bits of data are stored at the diffusion depletion edges by high current hot carrier generation. The other two bits are programmed and stored at the edges of the storage elements near the select/program element using a low current hot carrier generation method. These cells have a slightly higher density of storage for smaller number of bits but the use of the high current programming, for programming at the nodes near the junctions, resulting in higher program power. This is a major negative aspect of these cells.

OBJECTS AND ADVANTAGES

The main objects of the invention are as follows: The first object is to provide a group of MMT (Multi-bit non-volatile Memory Technology) based cells using traps in the Nitride layer for storage of data, in an ONO based storage element where in the density of storage can be increased by using multi-bit storage in the cell at defined locations in the Nitride layer. The MMT technology allows cells to be expanded to store multiple bits of data using an alternating combination of select/program element or gate and storage gate, where the storage gate consists of an ONO storage element under a control poly-silicon conductive layer.

A second object is to provide an alternate group of MMT (Multi-bit non-volatile Memory Technology) based cells using discrete silicon areas in the silicon-nodule layer for storage of data, in an OnsO based storage element where in the density of storage can be increased by using multi-bit storage in the cell at defined locations in the silicon-nodule layer. The MMT technology allows cells to be expanded to store multiple bits of data using an alternating combination of select/program element or gate and storage gate, where the storage gate consists of an OnsO storage element, under a control poly-silicon conductive layer, instead of the ONO layer described in object one.

A third object is to have a programming scheme that allows more than two storage nodes to be programmed per cell, increasing the capability to program one or two storage nodes per storage element with one to a multiple of storage elements being available per cell.

Another object is to have a more robust cell where in the use of the select/program elements reduce the programming current and hence the power dissipation during program operation.

A fifth objective is to reduce the design complexity by making over erasure of the cell and the associated leakage current of the un-selected cells on a bit line, a non issue during read of the selected memory cell by providing select gates that can be turned off in the un-selected cells during read operation.

Another object is to allow the cells to operate either in depletion or in shut off during program and erase, reducing the complexity of design.

Another object of the disclosure is to provide a wider margin of voltage between erased and programmed states to allow multiple levels of programming at a node for additional bits of storage.

Another object is to provide a cell that uses known high voltage tunneling (FN tunneling) for erasure of the data stored in a group of elements or all elements in the cell at a time.

A Ninth object is to provide a different method of erasure of the Nitride storage cell, and the silicon-nodule storage cell, namely the TG method Another object is to use the TG method of erasure to reduce the high voltage needed for tunnel erase.

Another object is to reduce the dependence on critical drain engineering for program at the drain depletion by channel Hot Electrons and erase based B to B tunneling of the prior art cells by use of the methods of program and erase disclosed.

Some of the advantages of the disclosed structures and methods are:

1. The cell programming structure for any program node with select/program element and storage element allow large multi-bit storage cells to be implemented.
2. The cell area can be utilized more effectively to provide a high density array.
3. The select/program gate usage for all program locations allow lower current and lower power program.
4. The use of ONO storage elements allow scaling of the cell with technology.
5. Similarly the use of OsnO storage elements allow scaling of the cell with technology.
6. Storage of up to two bits, one at each node on either end of the storage element, with out the use of multi-level storage is possible in each storage element.
7. Multiple storage gates, each with its own storage element, alternating with select/program gates form a memory cell capable of a large number of bits per cell.
8. The non-spreading locational storage of charge in Nitride films enable single Nitride film to be used as gate dielectric for storage element and select/program element, with some disadvantage in current carrying capacity, but making the cell more manufacturabile.
9. The high voltage tunneling erase uses only the control gate electrodes and provide flexibility for single element erase or cell erase.
10. The use of select/program gates move the storage elements away from junctions and reduce the need for critical drain engineering of the junctions for program erase.
11. The use of select/program gates allow the storage elements to be in depletion as the cell selection is by tuning on the select/program gates and not dependant on the charge on the storage elements. Hence unselected cells are turned off when implemented in an array and does not impact the read of the selected cell.

12. The ability to have the elements in depletion allow large voltage swings at the node with the possibility of additional level based multi-bit storage at each node itself 13. The TG erase is a lower voltage erase and again provide the flexibility of single element or cell erase.

DESCRIPTION OF DRAWINGS

FIG. 7. Cross section along the diffusions of a MMT-3 cell, a four bit programmable cell with optimized select/program elements and storage element with buried diffusion contacts with MIM Erase capability FIG. 8. Cross section across the cell in FIG. 8 across the cell showing the programming element.

EXPLANATION OF NUMBERING AND LETTERING IN THE FIGURES FOR TYPICAL IMPLEMENTATION OF THE TECHNOLOGY

Figure 1:
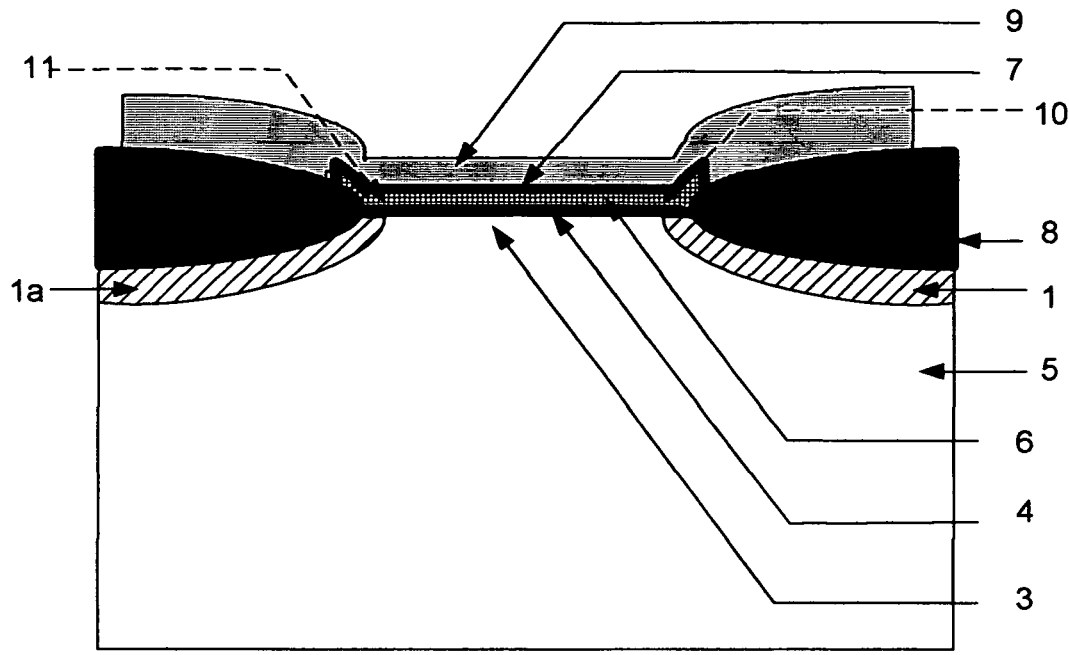
FIG. 1. Cross section along the diffusions of a Prior art NROM or Mirror Bit cell storing two bits of data FIG. 2. Cross section through the storage element across the cell of the Prior art NROM or Mirror Bit cell in FIG. 1.
Figure 2:
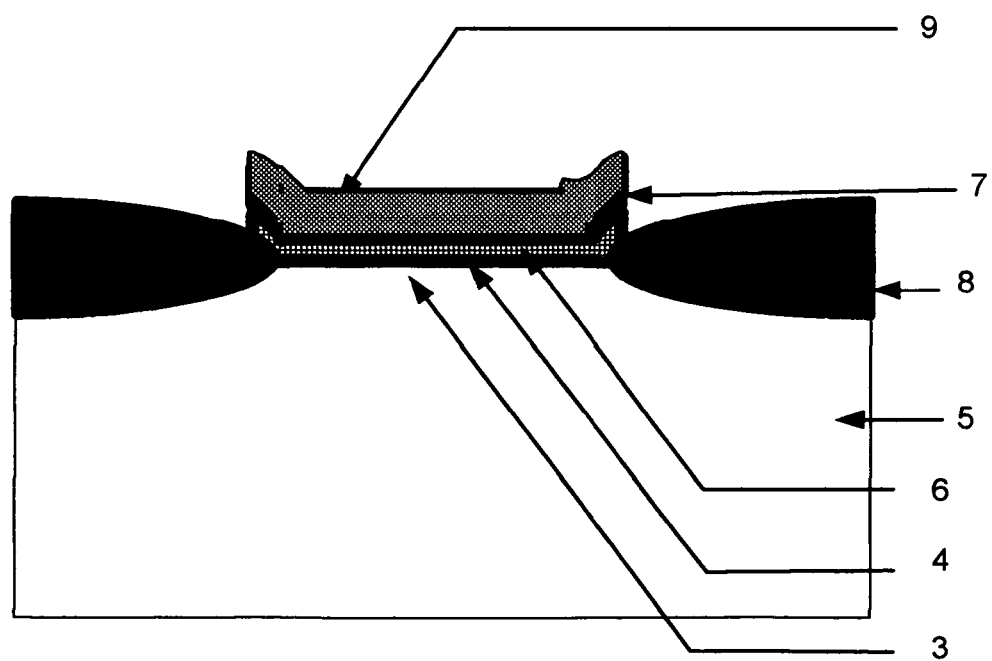

Prior Art Mirror Bit Cell (FIG. 1, and FIG. 2)
1. Diffusion 1 (S/D)
1a. Diffusion 2 (S/D)
3. Channel
4. Oxide (SiO2)
5. Well diffusion in Silicon
6. Nitride layer or Silicon-nodule layer
7. Oxide Note: Layer 4,6 and 7 together form an ONO layer or in the alternate case the OsnO layer.
8. Isolation
9. Poly Silicon layer Control gate
10. Location of storage of Bit 1
11. Location of Storage of Bit 2

Disclosed Multi-bit Memory Technology Cells

Figure 3:
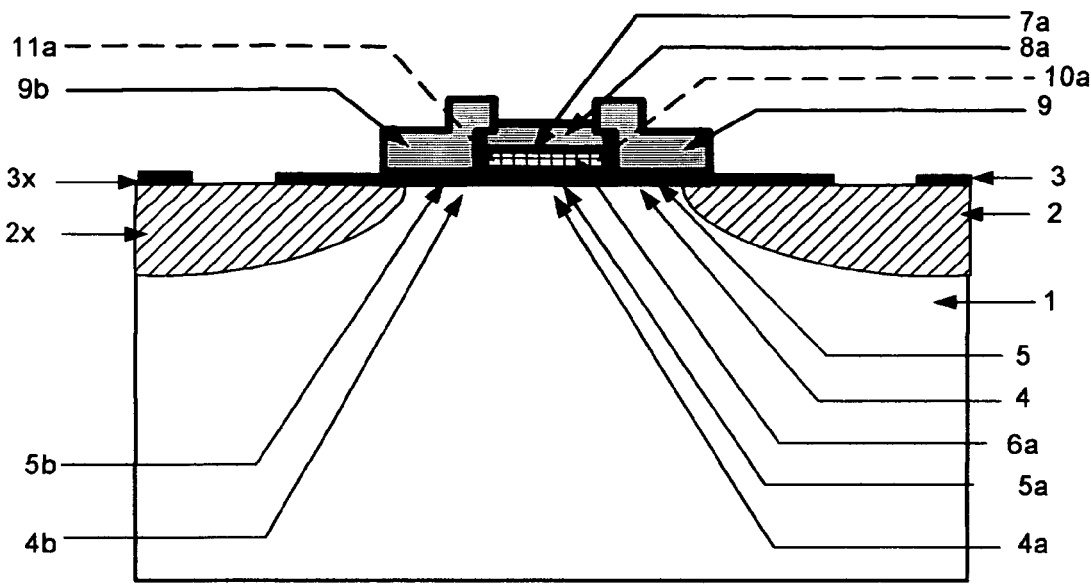
FIG. 3. Cross section along the diffusions of a MMT-1 cell, a two bit programmable cell with optimized select/program elements and storage element having external diffusion contacts.
Figure 4:
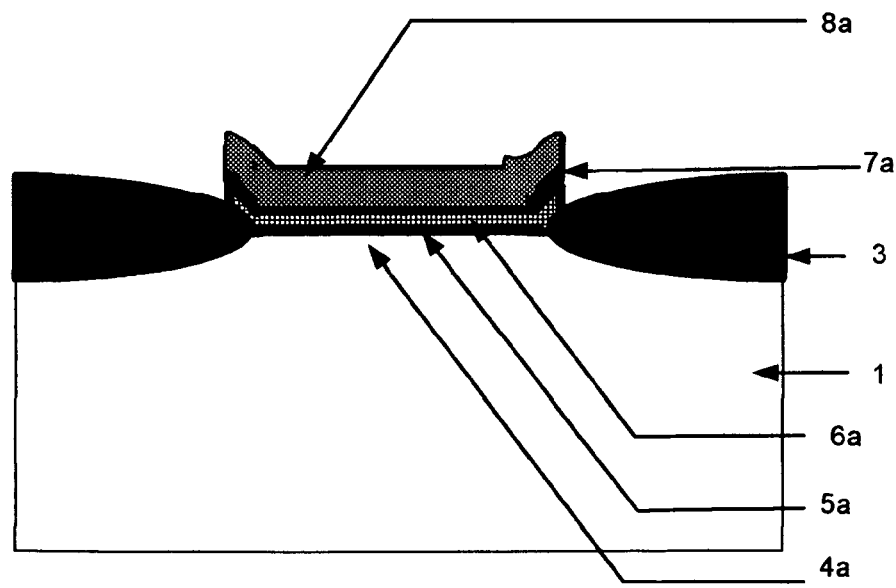
FIG. 4. Cross section across the cell in FIG. 3 across the cell showing the programming element.
Figure 15:
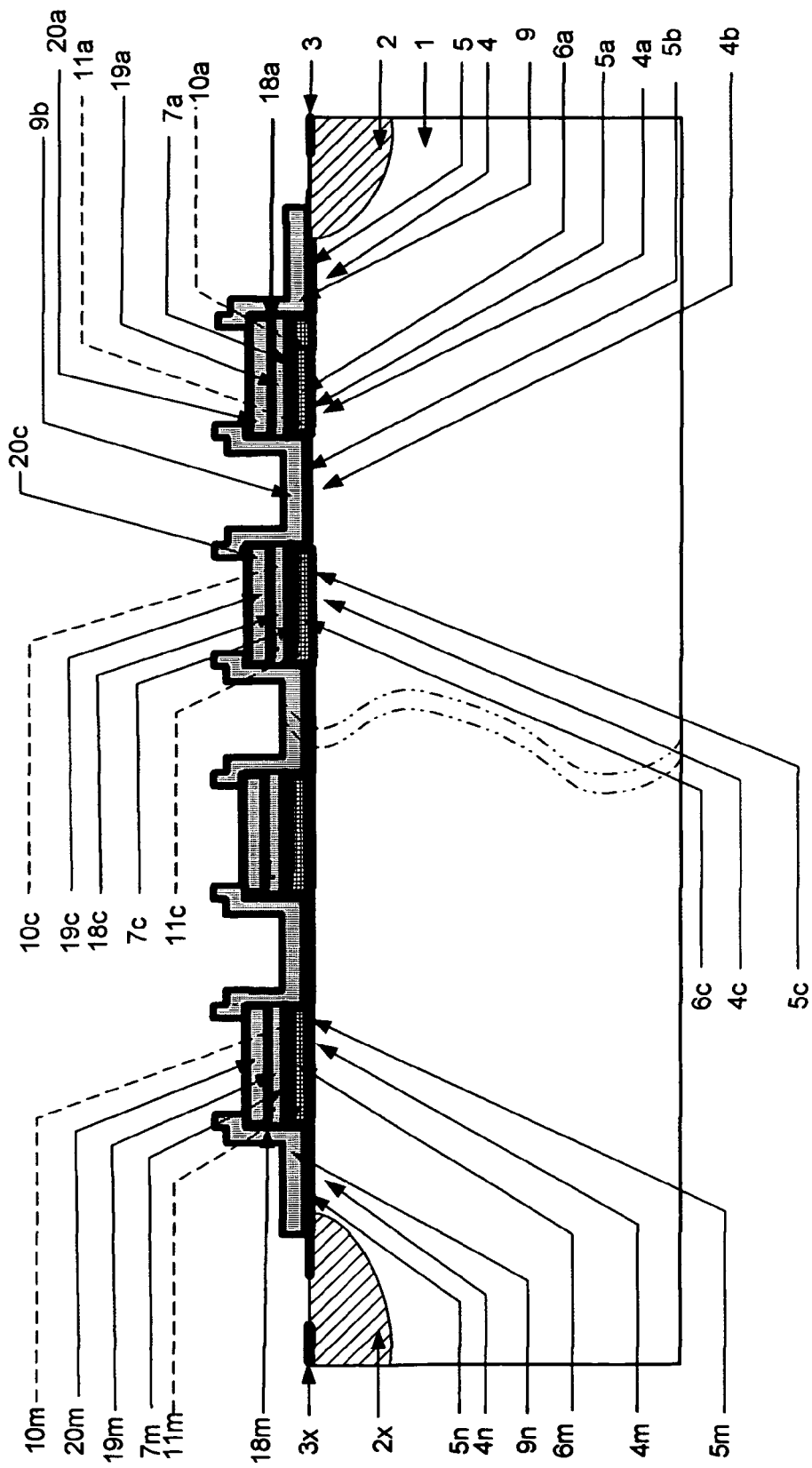
FIG. 15. Cross section along the diffusions of a MMT-6 cell having "m" data bit storage capability using the low current programming, with MIM erase capability.

MMT-1 Cell, (FIG. 3, and FIG. 4) MMT-2 Cell, (FIG. 5 and FIG. 6), MMT-3, (FIG. 7 and FIG. 8), MMT-4 Cell, (FIG. 9 and FIG. 10) MMT-5, (FIG. 11 and FIG. 12), MMT-6, (FIG. 13) and MMT-8, (FIG. 15)

Note.1: In the case of MIM erase cell MMT-3, the Control gate is replaced by the MIM stack comprising of Collection Grid electrode, Barrier layer and the Injector Electrode.

Note.2: Each number with letter combination denotes an element REGION in the cell.
1. Well in Silicon Substrate
2. 2x. Diffusions
3. 3x. Isolation Oxide
4. 4a, 4b, 4c, 4d. 4m. 4n. Integrated channel under each element
5. 5b, 5d. 5n Gate oxide
5a. 5c. 5m. Silicon Dioxide on silicon
   ($2^{nd}$ oxide of the ONO or OsnO storage element)
6a. 6c. 6m Silicon Nitride Storage layer or alternately silicon-nodule layer
   (Nitride storage layer of ONO storage element)
7a. 7c. 7m. Silicon Dioxide
   (1st oxide of the ONO or OsnO storage element)
8a. 8c. 8m. Control element (control gate layer)
9. 9b. 9d. 9n Select/Program element (select/program gate layer)
10a. $1^{st}$ bit storage location
11a. $2^{nd}$ bit storage location
10c. '$3^{rd}$ bit storage location
11c. 4th bit storage location
10m. $m^{th}$ bit storage location.
11m. $(m+1)^{th}$ bit storage location.
18a. 18c. 18m. Collection Grid electrode of MIM
   (bottom layer of MIM stack)
19a. 19c. 19m. Barrier (middle layer of MIM stack)
20a. 20c. 20m. Injector electrode (top layer of MIM stack)
MMT-7 Cell, FIG. 14
1. Well in Silicon Substrate
2. 2x. Diffusion
3. 3x. Isolation Oxide
4. 4a, 4b, 4c, 4d. 4m. 4n. Integrated channel under each element
5. Silicon Dioxide on silicon
   ($2^{nd}$ oxide of the ONO storage element)
6. Silicon Nitride Storage layer
   (Nitride storage layer of the ONO storage element)
7. Silicon Dioxide (Nitride Oxide)
   (1st oxide of the ONO storage element)
8a. 8c. 8m. Control element (control gate layer)
9. 9b. 9d. 9n Select/Program element (select/program gate layer)
10a. $1^{st}$ bit storage location
11a. $2^{nd}$ bit storage location
11c. $3^{rd}$ bit storage location 11c. 4th bit storage location
10m. m$^{th}$ bit storage location.
11m. (m+1)$^{th}$ bit storage location.

DESCRIPTION OF INVENTION

Multi-bit cells with storage in trap locations in Nitride and in potential wells in isolated (discrete) silicon nodules are disclosed. The cells are all capable of being programmed by hot electron programming (Channel Hot Electron or CHE), the preferred being a modified low current hot electron programming method, and erased by one of the two methods, FN tunneling from the storage sites due to applied potential or a lower voltage alternate disclosed method of erase that is by use of MIM (Metal-Insulator-Metal) for generating carriers of the opposite type from those used for program, and collection of part of the carriers so generated by the storage locations to erase the cells. This method used for energetic carrier generation is called the Tunnel-Gun or TG method. It should be noted that the TG method is capable with the right voltage application and choice of electrodes of generating either the positive or negative charge carriers. The application described is a typical one where the cell described is a n-channel cell where the erase is by generating energetic holes for collection in the storage layer for erase of the cell. Multiple cells have been disclosed using these methods of program and erase, that are capable of storing two bits to a larger number of bits in a cell.

FIG. 3, FIG. 4, FIG. 5, FIG. 6, FIG. 13 and FIG. 14 form a first group of cells that are erased by Fouler-Nordheim Tunneling (FN Tunneling) and have low current programming by Channel Hot Electrons (CHE).

FIG. 7, FIG. 8, and FIG. 15 form a second group of cells that are erased by use of MIM (Metal-Insulator-Metal) method and programming by the low current CHE. The MIM method of erasure is used to generate carriers having the opposing type of charge, typically holes with positive charge, as the carriers used during programming, typically negatively charged carriers or electrons, with the CHE programming method.

Figure 9:
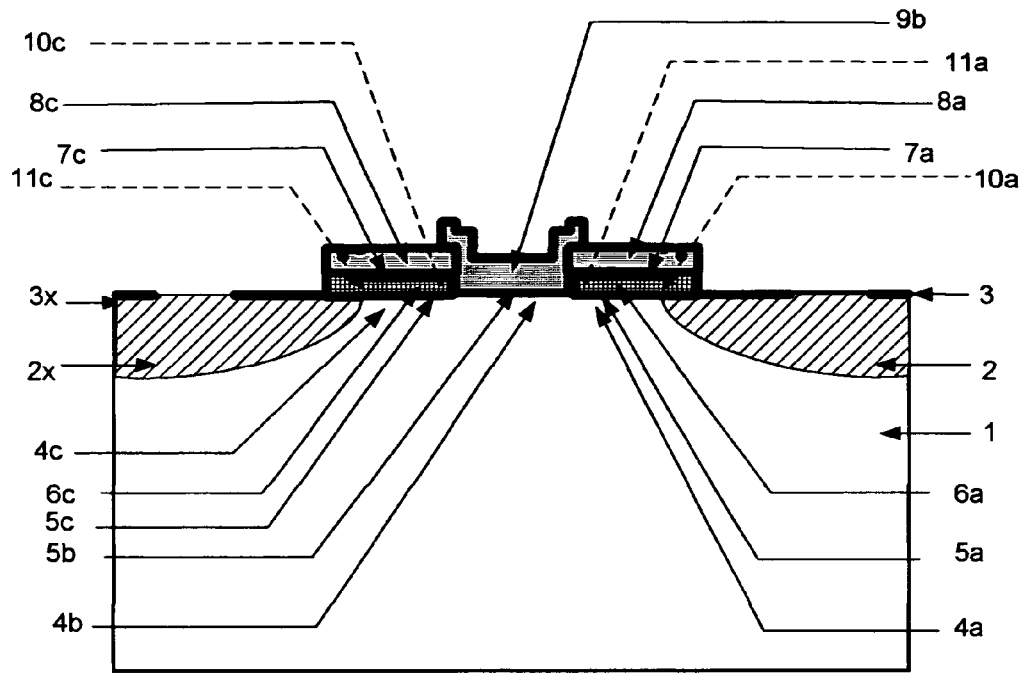
FIG. 9. Cross section along the diffusions of a MMT-4 cell, a four bit programmable cell with high current programming for two of the bits and low current programming for the other two-smaller cell size.
Figure 10:
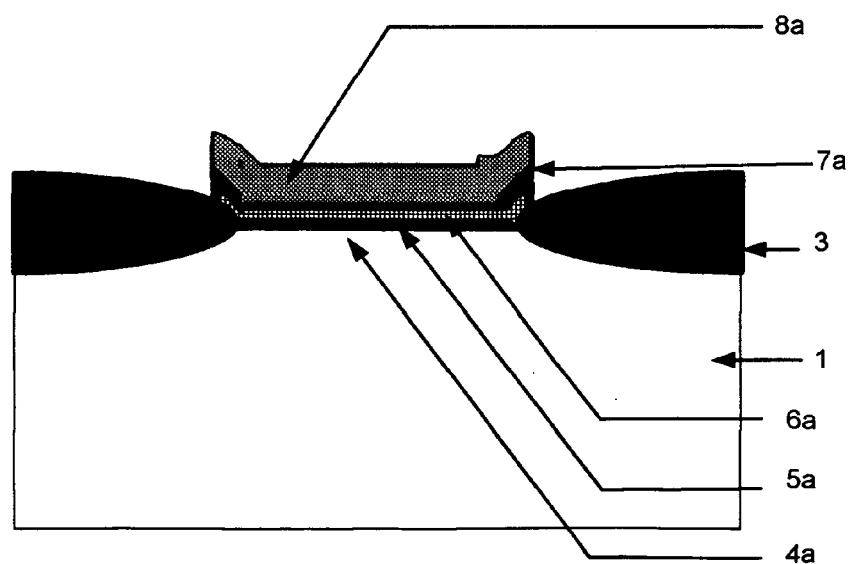
FIG. 10. Cross section across the cell in FIG. 9 across the cell showing the programming element.
Figure 11:
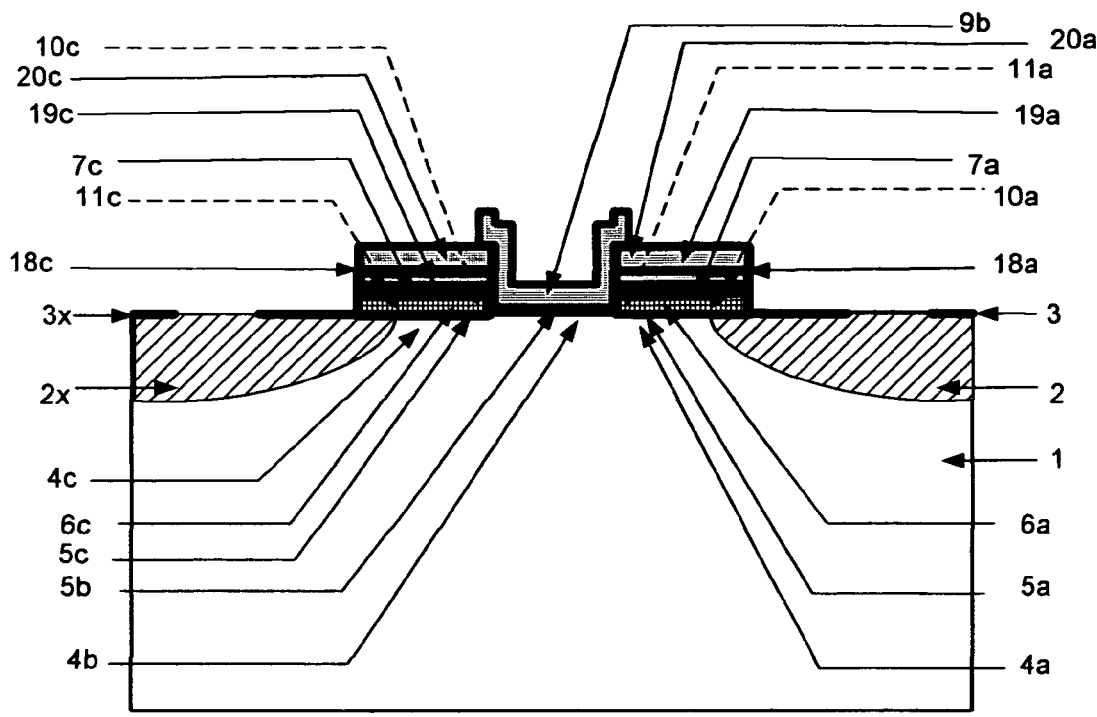
FIG. 11. Cross section along the diffusions of a MMT-5 cell, a four bit programmable cell with high current programming for two of the bits and low current programming for the other two, with MIM erase capability.
Figure 12:
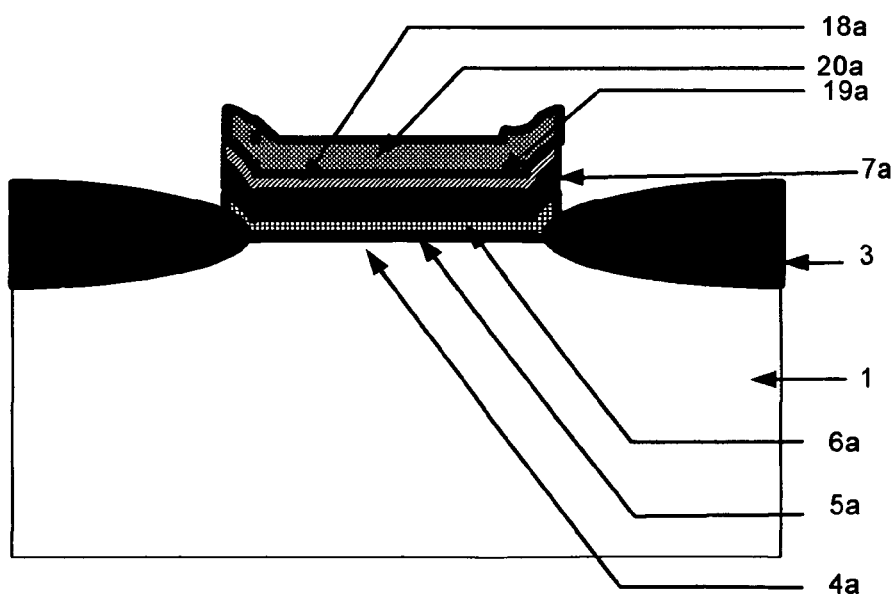
FIG. 12. Cross section across the cell in FIG. 11 across the cell showing the programming element.
Figure 13:
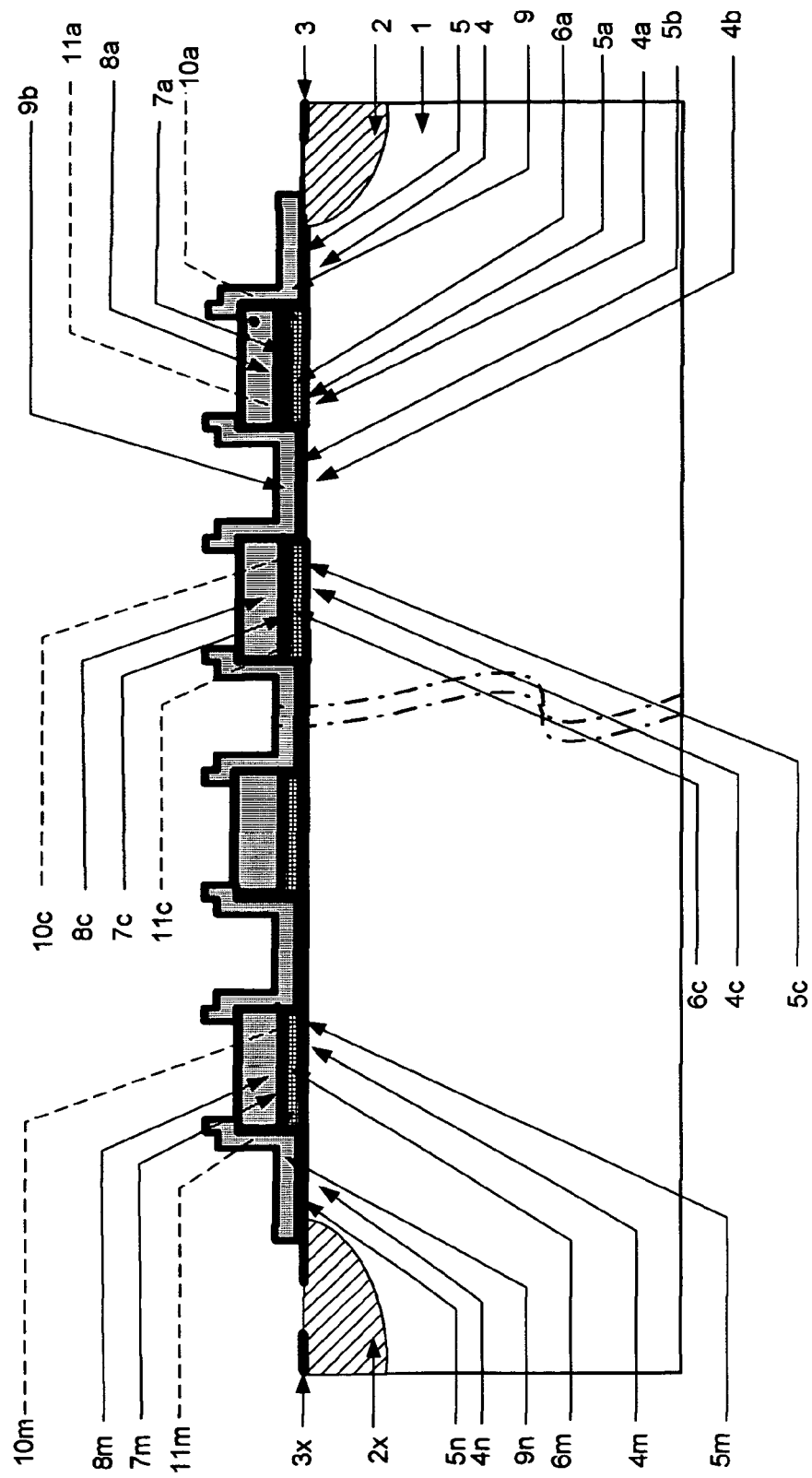
FIG. 13. Cross section along the diffusions of a MMT-6 cell having "m" data bit storage capability using the low current programming.

FIG. 9, FIG. 10, FIG. 11 and FIG. 12 form a third group of cells that are examples of multi-bit cells that use a combination of the High current CHE programming of the prior art at the junctions and low current CHE programming disclosed in the current application and hence are not optimum cells for low power applications. These cells will form a smaller size cells but with more complex peripheral programming circuitry. Once the disclosed low current method for the cells have been understood it will be possible for any individual technologist to implement these cells combining the prior art with the disclosed method. FIG. 9 and 10 are for cells which are erased using FN-Tunneling FIG. 11 and 12 are cells which are erased with MIM method of erase. These are provided as an example of combining the prior art technology with the proposed technology and no detailed explanation of the cell operation is provided.

Figure 5:
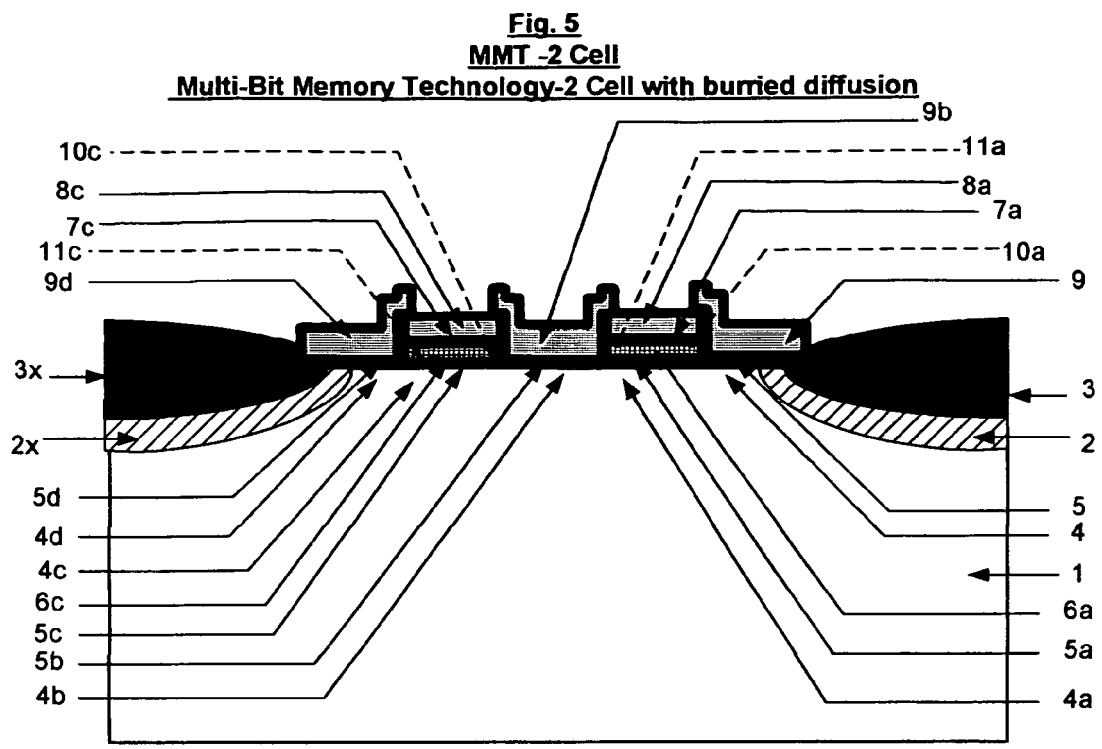
FIG. 5. Cross section along the diffusions of a MMT-2 cell, a four bit programmable cell with optimized select/program elements and storage element with buried diffusion contacts FIG. 6. Cross section across the cell in FIG. 5 across the cell showing the programming element.
Figure 6:
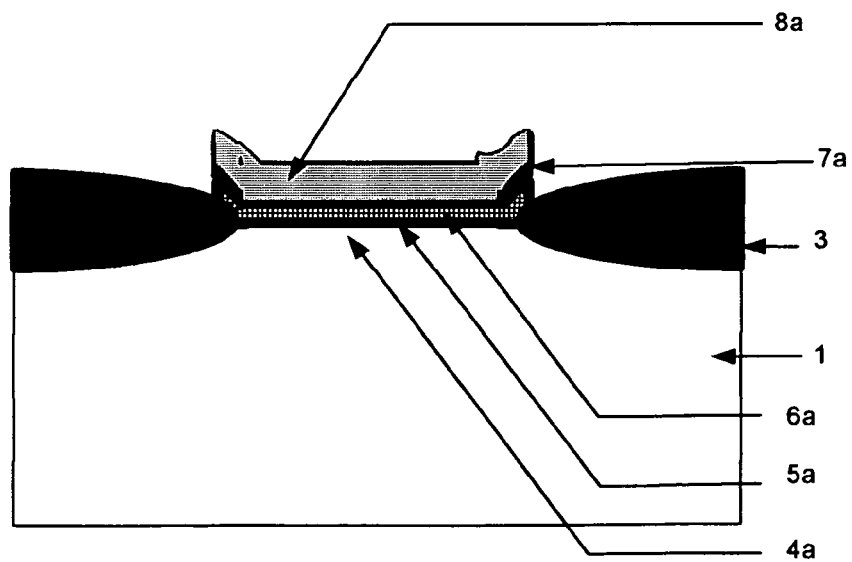

In order to simplify the description of the technology and the cells, the 4 bit cell shown in FIG. 5 and FIG. 6 (Group 1 cells) in the case of FN Tunneling erase cell and FIG. 7 and FIG. 8 (Group 2 cells) in the case of MIM method of erase are chosen. The explanation in these cases are easily extendable to each of the group of cells, to which these cells belong.

FIG. 5 and FIG. 6 show a 4 bit memory cell having three select/program gates and two storage gates, deposited in an alternating fashion over and integrated channel comprising the channel regions (4,4a,4b,4c, and 4d) under the gates, between two diffusion regions (2, 2x) forming the Source/Drain diffusions. The select/program gates separate the storage gates from each other and also keep them away from the diffusions. The storage gate in these memory cells consist of an ONO storage element, or alternately an OsnO storage element over which is a conductive, typically poly-silicon, control element or control gate layer is deposed.

The ONO storage element is made up of a stack comprising a silicon dioxide layer on silicon (5a or 5c), a Nitride layer (6a, or 6c) and a second Oxide layer (7a or 7c). The Nitride layer forms the storage layer and the charge carriers during programming are stored gets trapped in the trap sites that exist in the Nitride layer. Since the Nitride layer is non conductive the stored charge remains localized and does not spread throughout the storage layer. The two oxide layers form barrier layers on top and bottom, to prevent unwanted charge loss or accumulation in the Nitride.

Figure 14:
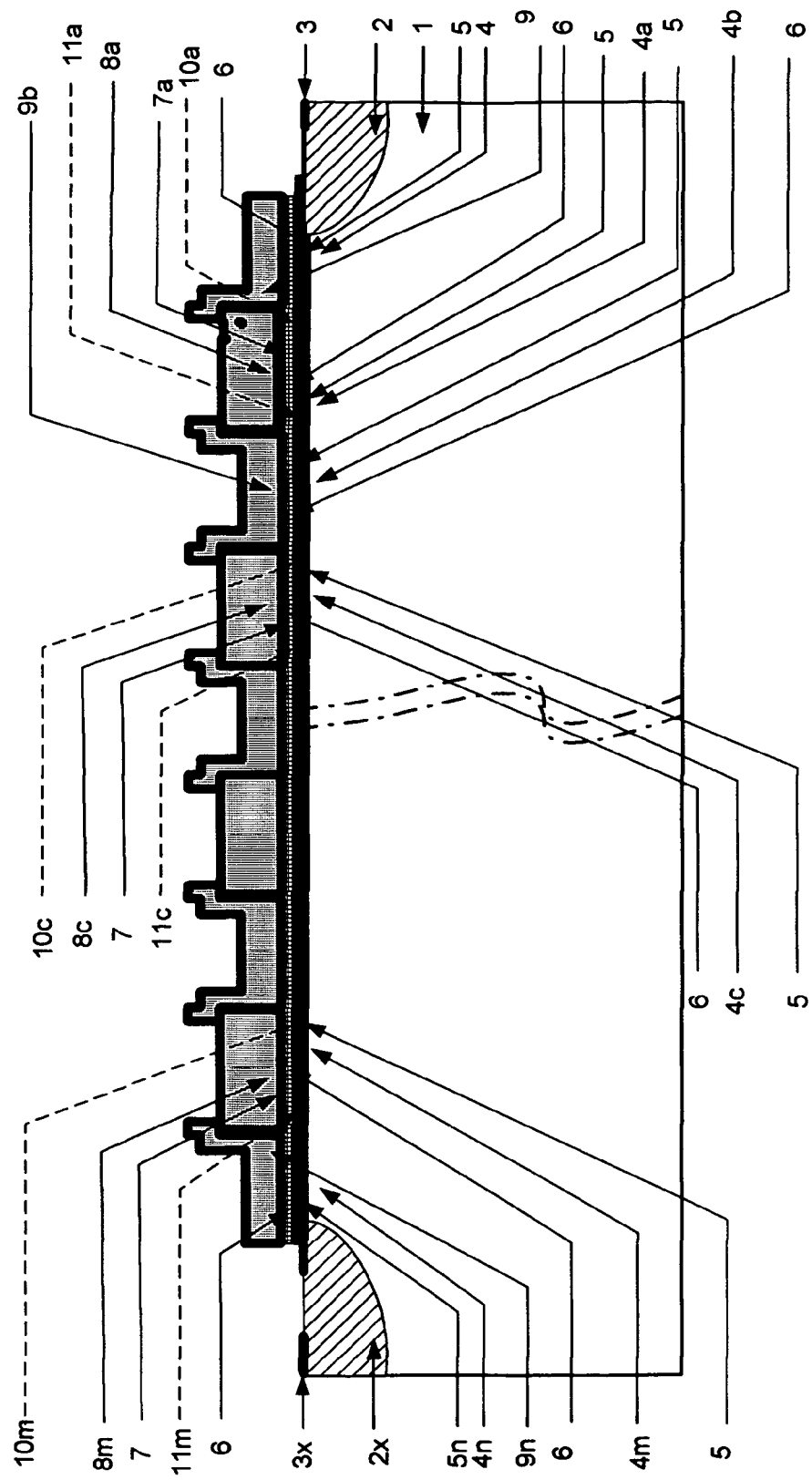
FIG. 14. Cross section along the diffusions of a MMT-6 cell having "m" data bit storage capability using the low current programming, with single Oxide Nitride-Oxide gate dielectric for storage elements and select/program elements.

In the alternate silicon-nodule storage, the OsnO storage element replaces the ONO storage element in the storage gates of the cells in the group, except for the cell in FIG. 14. The OsnO layer is also made up of a stack comprising an oxide layer on silicon (5a or 5c), a silicon-nodule layer (6a or 6c) having a few layers of discrete silicon nodules separated by thin barrier oxide, and a second oxide layer (7a or 7c). The silicon-nodule layer forms the storage layer where the charge carriers are stored in the isolated potential wells that exist in each nodule. The inter nodule barrier keeps the charge localized by preventing distributed by conduction. The top and bottom oxides form barrier layers to prevent unwanted charge loss or accumulation in the silicon-nodule storage layer.

In the typical implementation shown the storage gates have the storage element as the gate dielectric under a poly silicon conducting control gate layer while the select/control gates have an oxide dielectric under a poly-silicon conducting select/program gate layer.

As indicated earlier one implementation where the ONO layer cannot be replaced completely by the silicon-nodule layer is the implementation shown in FIG. 14 or similar implementations. Here a single ONO layer is used as the gate dielectric for the whole integrated channel. This use of the ONO allows the design to be implemented easily with reduced complexity in process. The disadvantages are the need for thicker than minimum gate dielectric for the select/control gates and possible residual charge in the nitride under the select/program gates affecting the performance as the number of write erase cycles are increased.

In all the cells shown there are two storage locations or storage nodes (10a to 10m and 11a to 11m) per storage element in a storage gate that can be programmed. It is also possible to only program one location per storage gate, rather than two for simplicity of operation.

Per example of the four bit cell in FIG. 5 and FIG. 6, there are four storage nodes (10a, 11a, 10c, 11c) in the two storage elements, storage element a comprising the stacked layers (5a,6a and 7a) over the channel (4a) and storage element c comprising the stacked layers (5c, 6c, and 7c) over the channel 4c, associated with the two storage gates a first storage gate (storage gate-a) and a second storage gate (storage gate-c) that comprise the respective storage elements underlying the respective conductive control gate layer or control gate element (8a and 8c). The first storage element (storage element-a) has the storage nodes (10a and 11a) and the second storage element (storage element-c) has the storage nodes (10c and 11c).

The storage gates are separated from the diffusions (source/drain diffusions) (2 and 2x) and each other by the three select/program gates, a first select/program gate (select/program gate 0) adjacent to the diffusion (2) on one side and the first storage gate on the other side, a second select/program gate (select program gate-b) separating the two storage gates (storage gate-a and storage gate-c) and a third select control gate (select control gate-d) adjacent to the diffusion ($2x$) and the second storage gate (storage gate-c)

The first select/program gate-0 comprise the gate oxide layer (5) over lying the channel (4) over which is deposed the conductive select/program element or select/program gate layer (9). Similarly the second select/program gate-b comprise the gate oxide layer ($5b$) over lying the channel ($4b$) over which is deposed the conductive select/program element or select/program gate layer ($9b$) and the third select/program gate-d comprise the gate oxide layer ($5d$) over lying the channel ($4d$) over which is deposed the conductive select/program element or select/program gate layer ($9d$).

The channel in silicon between the diffusions is an integrated channel that lies in the silicon beneath the gate dielectrics of the set of gates, in order, select/program gate-0, storage gate-a, select/program gate-b, storage gate-c and select/program gate-d.

The second group of cells, represented by FIG. 7 and FIG. 8 are similar to the FIG. 5 and FIG. 6 except in that, in the storage gate, the conductive control gate layer is replaced by a stack making up the electrodes of an MIM structure for generating energetic carriers or the TG. The TG stack comprise a conductive grid electrode ($18a$, $18c$), typically doped poly-silicon, a barrier layer ($19a$, $19c$), typically silicon dioxide, and an injector layer ($20a$,$20c$). The TG stack comprising $18a$, $19a$, and $20a$, replace the control gate element $9a$ in the storage gate-a and the MIM stack comprising $18c$, $19c$, and $20c$, replace the control gate element $9c$ in storage gate-c of the FIG. 5. In normal operation except during erase the TG stack as a whole act similarly to the control gate layer for the storage gates.

Operation:

Programming:

The operation of the MMT cells are also explained using the four bit cells of FIG. 5 and FIG. 7.

Taking the FIG. 5, the cell has four storage nodes that can be programmed. They are the $10a$, and $11a$ that are part of the storage gate-a and $10c$ and $11c$ that belong to the storage gate-c. If the cell uses the traps in a Nitride storage layer in an ONO storage element, potential wells in silicon-nodules in an OsnO storage layer, in order to program the storage node $10a$ the selected storage gate is storage gate-a and the selected select/program gate is the select/program gate-0. The following steps are necessary:

a. The diffusion $2x$ is made the drain diffusion and diffusion 2 is made the source diffusion. A reasonably high voltage of sufficient magnitude, typically 3 to 7 V is applied to the drain diffusion closer to opposing end of the storage element where the storage node being programmed reside, that is for programming node $10a$ the drain voltage is applied to drain $2x$.

b. The unselected storage gate (storage gate-c) has high voltages applied to it through the control gate layer ($8c$) such that this gates has voltage sufficient to fully turn on the channel ($4c$) under the gate irrespective of whether the storage nodes ($10c$ and $11c$) in the nitride storage layer ($6c$) of the storage gate have been previously programmed or left unprogrammed, typically in the range of 3 to 5 V.

c. The unselected select/program gates (select/program gate-b and d) have enough voltage applied to them through the control gate layer ($9b$ and $9d$) to turn them, namely the channel regions ($4b$ and $4d$) controlled by them fully on, typically again in the 3 to 5V range.

d. A high collection voltage is applied to the control gate layer ($8a$) of the selected storage element where in the storage node ($10a$) reside, turning on the channel under the storage element. The typical voltages are in the 3 to 8V range.

e. Apply a voltage, on the selected select/program gate, adjacent the storage node ($10a$), through the selected control gate layer (9), such that the channel (4) of the select/program gate is just turned on, typically in the 0.3 to 1V range.

The channel of the selected select/program gate will hence operate in a pinched off condition allowing limited current flow. Electrons from the source (2) will flow to the drain limited by the gate potential on the selected select/program gate layer (9) This will allow the carriers, typically electrons, in the channel to achieve saturation velocity or close to it. When they encounter the high field at depletion region at the selected node due to the drain voltage passed through by the fully turned on unselected storage and select/program gates, the carriers will achieve the hot carrier status in the high field and enable CHE programming at the node due to the existing high collection voltage on the gate. The carriers that overcome the barrier will be trapped in the discrete trap sites that exist in the Nitride layer ($6a$) or alternately the discrete potential wells that exist in the silicon-nodule layer ($6a$) at the selected storage node and be stored.

If the next bit has to be programmed on the same storage element, at the storage node $11a$, the procedure is similar. The diffusion 2 which is on the opposing end of the storage element where the storage node $11a$ is is made the drain diffusion and the diffusion $2x$ is now the source diffusion. The selected storage gate is still storage gate-0 while the selected select/program gate is select/program gate-b. The unselected gates are biased with high voltages to provide a low resistance path for the current and minimum voltage drops in the channel under the gates. The selected storage gate is biased with high voltage on the control gate layer, to enable collection of the hot-carriers generated adjacent the storage node in depletion region of the channel under the influence of the drain voltage. The hot carriers are generated due to the velocity saturated carriers produced by the pinched off channel of the turned on select program gate which is in a low current saturation condition due to the low turn on voltage applied the select/program gate layer of the select/program gate-b and the depletion field due to the drain voltage. Part of these carriers with the correct velocity component will be accelerated towards the barrier oxide by the collection voltage applied to the control gate layer of the storage gate and will overcome the barrier to get collected in the storage element at the selected storage node.

Erasing:

The erase uses two methods. One is the standard Fouler-Nordheim (FN) tunneling method as applied to FIG. 5, that applies a high voltage across the storage element, that is of sufficient magnitude and is in a direction that allows the charge to be extracted from the traps in the Nitride or alternately the potential wells in the silicon-nodule layer and be removed by tunneling through the barrier, there by erasing the data. This is done, typically by applying a negative high voltage to the control gate layer ($8a$ and $8c$), to generate the necessary high voltage gradient across the storage layer ($6a$ and $6c$) to erase the cell. In a typical implementation the select gates are held in the off state.

The FN tunneling is a well known phenomena but it has been found that this is not the best way to erase the Nitride or the silicon-nitride based cells. This is due to the fact that FN tunneling requires very high voltage gradients to extract the charge especially from the traps and cause them to tunnel out through the barrier oxide. A better erase method is by generating carriers of the opposite charge which can the be allowed to neutralize the charge in the traps and the potential wells.

The prior art described uses the Band to Band tunneling in a high doped junction to create holes which are then attracted to the traps to do the erase.

The second method of erase is by use of Metal-Insulator-Metal diode method or TG method of generating the required type of carriers, which are then used to erase the data at the storage nodes that is explained by use of FIG. 7. The carriers used for erase have a charge with the opposing polarity, (typically holes in the cells shown), as the carriers used for program, (typically electrons). The TG stack or TG comprise of a thin conductive grid collector, Grid electrode, or Grid layer (18*a*, 18*c*), typically a high work function metal or a P-doped poly-silicon (for erase by holes), that has a thickness much less than the mean free path of the carriers being injected, typically in the 100 to 350A range, deposed over the storage element. A thin tunnel barrier layer (19*a*, 19*c*), typically an oxide layer of 20 to 60A, is deposed on top of the conductive Grid layer. A thicker conductive Injector Electrode or Injector layer (20*a*. 20*c*), typically P-doped Poly-silicon (for a hole injector), is deposed on top of the barrier oxide to complete the TG stack. When a voltage gradient is applied across the barrier layer, by applying a voltage, typically in the 4 to 8 V range, to the injector poly-silicon with application of a lower voltage 1 to 3V to the grid layer or grid electrode, the positive carriers from the injector electrode are able to overcome the barrier and get injected into the grid electrode. The carriers that enter the grid electrode have high energy and move through the grid electrodeake place, where carriers collide with atoms and loose energy and get collected. Since the grid electrode layer is a thin layer that has a thickness much less than the mean free path of the carriers, a portion of the carriers that enter the grid layer pass through the layer without collisions and loss of energy, such that they have enough energy to over come the oxide barrier protecting the storage layer. If a small voltage gradient exist across the storage element, these carriers that enter the storage element will drift across the barrier and get collected by the traps of the nitride storage layer or the potential wells of the silicon nodule layer, there by neutralizing the charge that exist in the storage nodes and hence erasing the data in the storage element.

In most cases the positive charge will accumulate in the storage element at all locations including the storage node during an erase. This will leave the storage gate in a depletion mode. The existence of the select gates are essential, under the depletion conditions of the storage gates, to make sure that the unselected memory cells do not conduct (provide leakage current) and create false reads during the read of a selected node of a selected cell.

Even though a hole injection based erase of an N-channel memory cell which programs using electrons is described, the TG structure is capable of generating electrons for program or erase of a memory cell. The doping of the poly-silicon and the applied voltage gradient need to be altered for this purpose as will be known to any practitioners of the art.

Reading the Cell:

Typical way to read the stored data from the cell is explained in the following description. Other ways of reading data are possible with application of different voltages to the cell gates as will become evident to those who are conversant with the memory cell and work with it.

The cell is read out by choosing a specific storage node for the read operation. In both the implementations shown, FIG. 5 and FIG. 7 the read out is accomplished in a similar fashion. In FIG. 7 the conductive layers of the TG or TG stack are used as a single layer by having the two layers (18*a*,20*a* and 18*c* and 20*c* for the two storage gates) at the same potential, that is the TG in FIG. 7 acts as the control gate layer for these cells similar to the control gate layer of the FIG. 5.

Assuming that the storage node 10*a* on storage layer 6*a* is being read out, the diffusion 2*x* is made the drain by applying a read voltage to it and diffusion 2 is made the source. All the select/program gates are turned on hard by applying sufficient voltage to the select/program gate layers (9,9*b* and 9*d*) to have the gates in full conduction with the channel (4, 4*b* and 4*d*) associated with the gates in the on condition, that is conducting. All the storage gates except the selected storage gates where the node (10*a*) exist are turned on with fully, with conducting channels (4*c*) in full conduction by application of a sufficiently high voltage to the control gate layer (8*c*) or TG stack layers (18*c* and 20*c*) of the unselected storage gate to ensure the channel is fully on even under the condition where the storage nodes (10*c* and 11*c*) are programmed. A voltage sufficient to turn on the channel (4*a*) of the selected storage gate is applied tom the control gate layer (8*a*) or the TG stack layers (18*a* an 20*a*) such that the cell is in conduction if the storage nodes (10*a* and 11*a*) are with 0 charge or in the neutral condition.

Due to the application of the drain voltage at diffusion 2*x*, with all gates to the selected gate in the fully on condition the voltage applied is transmitted to the edge of the selected gat with minimum resistive drop due the channel resistance. A depletion region will exist at the edge of the selected cell which will tend to mask out and reduce the effect of the state of storage node 11*a* and allow the read current to be mainly dependant on the node 10*a*. Thus allowing the 10 a node status (programmed or erased) to be read out.

Now if node 11*a* has to be read a similar procedure is done but diffusion 2 is made the drain diffusion while diffusion 2*x* is made the source diffusion. This allows the influence of node 10*a* to be masked by the depletion region from the voltage applied to drain 2 transmitted over to the selected storage gate edge allowing the status of node 11*a* to be the major influence on the read current, allowing it to be determined. Other storage nodes of the cells 10*c* and 11*c* can also be read out in a similar fashion as the nodes 10*a* and 11*a*.

What is claimed is:

1. A multi-bit non-volatile memory cell, capable of being programmed and erased, having select/program gates and storage gates, and having integrated channel in silicon underlying the gates, between two diffusion regions, wherein the cell is capable of storing multiple bits of data by programming and erasing at storage node in storage elements of each of the storage gates, each bit being programmed by a low current hot electron programming, wherein the select/program gates and storage gates are disposed in an alternating fashion over the channel such that the storage gates are spaced away from the diffusion regions by having select/program gates arranged adjacent to the diffusion regions, and wherein the cell is capable of storing multiple bits of data in storage elements within the storage gates.

2. The multi-bit non-volatile memory cell in claim 1, said memory cell capable of being programmed and erased using carriers generated by a Tunnel Gun (TG), wherein the TG used for erase acts as the control gate during program and read operations.

3. The multi-bit non-volatile memory cell in claim 1, wherein each storage gate comprises a poly-silicon control gate overlaying an ONO storage element that overlays a portion of an integrated channel region on silicon.

4. The multi-bit non-volatile memory cell in claim 1, wherein each storage gates comprises a control gate, in the form of a Metal-Insulator-Metal (MIM) stack used as a grid collector and an Injector separated by a tunneling barrier layer, overlaying an ONO (Oxide-Silicon Nitride-Oxide) storage element that overlays a portion of an integrated channel region on silicon.

5. The multi-bit non-volatile memory cell in claim 1, wherein each storage gate comprises a poly-silicon control gate overlaying an OsnO (oxide-Silicon Nodule-Oxide) storage element that overlays a portion of an integrated channel region on silicon.

6. The multi-bit non-volatile memory cell in claim 1, wherein each storage gates comprises a control gate in the form of a MIM stack used as a grid collector and an injector separated by a tunneling barrier layer, overlaying the OsnO storage element that overlays a portion of an integrated channel region on silicon.

7. The multi-bit non-volatile memory cell in claim 1, wherein each storage elements comprises an ONO structure having a first Oxide layer, Nitride storage layer, and a second Oxide layer, and wherein charge is stored in traps in the Nitride layer.

8. The multi-bit non-volatile memory cell in claim 1, wherein the storage element of each storage gates comprises a first Oxide layer, a silicon-nodule storage layer, and a second Oxide layer (OsnO), wherein charges are stored in potential wells of discrete barrier isolated silicon-nodules that exists in the silicon-nodule layer.

9. A method for programming the multi-bit non-volatile memory cell in claim 1, wherein the programming of any bit comprises:
  applying a high voltage to a diffusion closer to opposing end of the storage element where the storage node being programmed resides;
  applying a high voltage to control gate overlaying the storage element of all unselected storage elements, sufficient to fully turn on the channels under all the programmed and un-programmed storage gates, other than the channel underlying the selected storage element;
  applying a high collection voltage to the control gate of the selected storage element where the storage node resides, turning on the channel under the storage element;
  applying a high voltage sufficient to turn on all the select/program gates fully except the select/program gate adjacent the storage node being programmed; and
  applying a voltage just sufficient to turn on the select/program gate adjacent the storage node, such that hot electrons are generated adjacent the storage node being programmed and trapped in the storage element at the storage node.

10. The multi-bit non-volatile memory cell in claim 1, wherein programming operation, hot electrons are generated by impact ionization due to velocity saturated carriers from a pinched off channel region of the selected select/program gate at a depletion region adjacent the selected storage node, wherein a few of the carriers achieve enough energy to overcome the oxide barrier and get stored in the storage layer at the storage node under the influence of a high voltage applied to the selected control gate.

11. The multi-bit non-volatile memory cell in claim 1, wherein erase operation is performed by Fowler-Nordheim tunneling.

12. The multi-bit non-volatile memory cell in claim 1, wherein the erase is by generating carriers having an opposite charge from the carriers stored during programming, using MIM method for collection by and storage in the storage element.

13. A method of programming a multi-bit memory cell having select/program gates and storage gates disposed in an alternating fashion over an integrated channel between two diffusion regions, such that the storage gates are separated from the diffusions by interposing a select/program gate, where the combination of control gates and select gates enable lower current programming of a storage node in a storage element in the storage gate by hot carrier programming, said method of programming comprising:
  applying a voltage between the source and drain of the cell;
  applying a voltage on the control and select gates of all unselected storage elements to turn the underlying channel fully on;
  applying a voltage just sufficient to turn the select device adjacent the selected storage node on; and
  applying a high voltage on the control gate of the selected storage element such that hot carriers are generated and at the interface between the storage element and the selected gate adjacent the selected storage node for collection and storage at the storage node to thereby program the storage node.

14. The method of programming the multi-bit memory cell in claim 13, wherein the storage gate comprises an ONO storage element on silicon under-laying a conductive control gate, wherein the multi-bit memory cell is programmed by storage of charges in traps existing in a Nitride storage layer forming part of the ONO storage element.

15. The method of programming the multi-bit memory cell in claim 13, wherein the storage gate comprises an OsnO storage element on silicon under-laying a conductive control gate, wherein the multi-bit memory cell is programmed by storage of charges in potential wells existing in discrete and barrier isolated silicon-nodules existing in a silicon-nodule storage layer forming part of the OsnO storage element.

16. The method of programming a multi-bit memory cell in claim 13, wherein hot carriers are generated in the channel depletion region adjacent to the storage node by impact ionization by applying a high drain voltage and velocity saturated carriers in the channel of a selected select/program gate, that is in a pinch off condition, adjacent a selected storage gate having a selected storage node in the selected storage element, wherein a portion of carriers having the right velocity component are accelerated towards the storage element by the voltage applied to the control gate, to overcome the oxide barrier and being stored in the storage node of the storage element.

17. A method for erasing a storage element in a multi-bit memory cell, having select/program gates and storage nodes disposed in an alternating fashion over an integrated channel between two diffusion regions, capable of being programmed and erased, wherein the erase operation is performed using a Tunnel Gun (TG) with an Metal-Insulator-Metal (MIM) diode structure disposed over a storage element for generation of carriers of a appropriate polarity for erase, said TG having a first thin conductive element forming a grid collector disposed over a top insulating layer of a storage element with a tunnel dielectric and a conductive injector further disposed over the grid collector, the tunnel dielectric forming an insulating layer between the two conductive layers, said erasing method comprising:
  applying a potential difference between the injector and the grid collector to enable tunneling of carriers of an opposite polarity to that of carriers used for programming the cell from the injector to the grid collector, wherein a portion of carriers achieve enough energy to pass through the thin grid collector to the top insulating layer of the storage element; and applying a potential on the storage element to enable the carriers in the top insulating layer to be trapped within the storage element, wherein charges previously stored within the storage element are neutralized by the trapped carriers to thereby erase the storage element.

* * * * *